United States Patent
Häfner et al.

(10) Patent No.: US 8,767,420 B1
(45) Date of Patent: Jul. 1, 2014

(54) POWER SUPPLY FOR CONTROLLING A POWER SWITCH

(75) Inventors: Jürgen Häfner, Ludvika (SE); Christer Fessel, Töcksfors (SE)

(73) Assignee: ABB Technology AG, Zurich (CH)

(*) Notice: Subject to any disclaimer, the term of this patent is extended or adjusted under 35 U.S.C. 154(b) by 0 days.

(21) Appl. No.: 14/129,027

(22) PCT Filed: Jun. 27, 2011

(86) PCT No.: PCT/EP2011/060721
§ 371 (c)(1),
(2), (4) Date: Mar. 10, 2014

(87) PCT Pub. No.: WO2013/000500
PCT Pub. Date: Jan. 3, 2013

(51) Int. Cl.
*H02M 5/45* (2006.01)
(52) U.S. Cl.
USPC .............................. 363/37; 323/282
(58) Field of Classification Search
CPC ............ H02M 3/157; H02M 1/0845; H02M 2001/008
USPC ........... 363/16–20, 34–39, 41, 56–57, 65, 71, 363/98, 132; 323/282–288; 361/91.5, 820
See application file for complete search history.

(56) References Cited

U.S. PATENT DOCUMENTS

| | | | |
|---|---|---|---|
| 3,794,908 A * | 2/1974 | Lindblom et al. | 363/68 |
| 3,821,564 A | 6/1974 | Lindblom et al. | |
| 4,613,932 A | 9/1986 | Cibulka et al. | |
| 5,347,166 A * | 9/1994 | Schauder | 307/113 |
| 5,450,308 A * | 9/1995 | Tai | 363/57 |
| 5,920,472 A * | 7/1999 | Bijlenga et al. | 363/97 |
| 6,021,036 A * | 2/2000 | Bijlenga et al. | 361/100 |

FOREIGN PATENT DOCUMENTS

| | | |
|---|---|---|
| DE | 2 302 530 A1 | 8/1973 |
| EP | 0 669 701 A1 | 8/1995 |
| WO | WO 02/23704 A1 | 3/2002 |

\* cited by examiner

*Primary Examiner* — Rajnikant Patel
(74) *Attorney, Agent, or Firm* — Birch, Stewart, Kolasch & Birch, LLP

(57) ABSTRACT

It is presented a power supply for providing power to control a power switch for a high voltage application. The power supply comprises: a high voltage divider arranged to be connected to a first current terminal of the power switch; a step down DC/DC converter connected to an output of the high voltage divider, wherein the step down DC/DC converter is arrange to provide an output voltage for control of the at least one power switch to an output of the power supply; and a bypass control unit arranged to control the high voltage divider to short circuit an main input and a main output of the high voltage divider when the voltage across the power switch is lower than a threshold voltage.

20 Claims, 4 Drawing Sheets

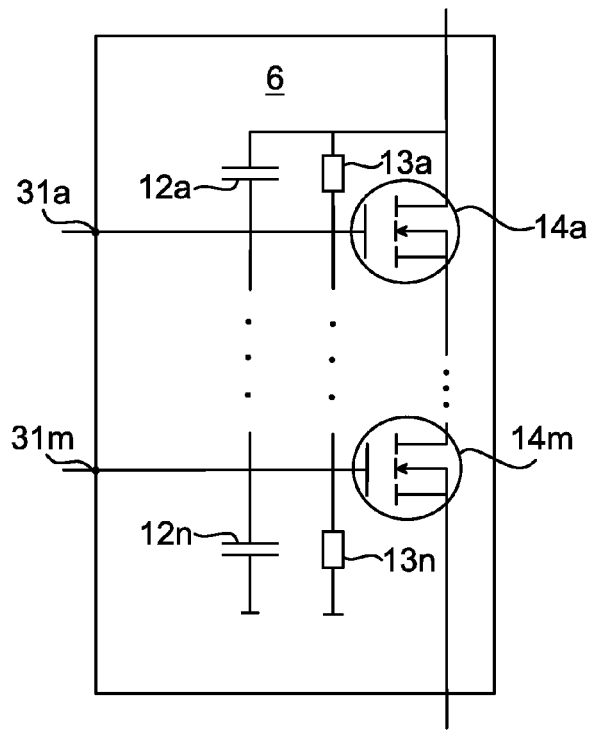
Fig. 3
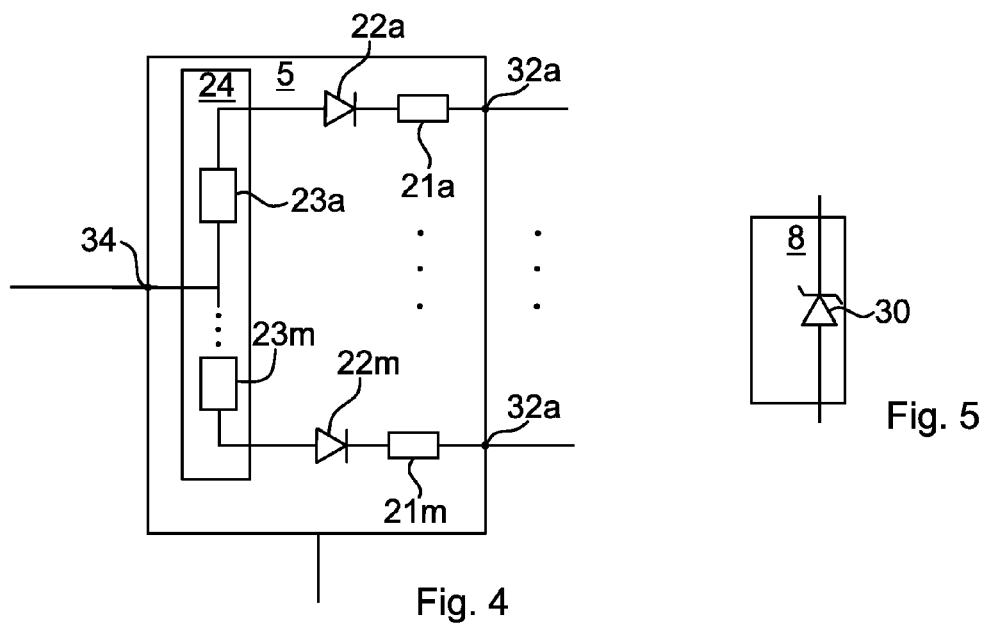
Fig. 4
Fig. 5

POWER SUPPLY FOR CONTROLLING A POWER SWITCH

TECHNICAL FIELD

The invention relates to a power supply for providing power to control a power switch for a high voltage application.

BACKGROUND

Power switches such as insulated-gate bipolar transistors (IGBTs) can be used for many high voltage applications. The gates of the IGBTs can be driven by means of a respective gate unit. When the IGBTs are used e.g. as part of an inverter, by using pulse width modulation (PWM) the IGBTs are continually switched on and off to achieve a sinusoidal waveform. When the IGBTs are off (blocking), the voltage across the IGBT can be used to power the gate unit. Power can be stored between switches e.g. in capacitors to ensure the gate unit is continuously powered.

However, when the IGBTs are used in an application where the IGBTs are conducting during a majority of the time, such as for a DC breaker, there is no reliable reoccurring time when the IGBTs are blocking, to charge up energy to power the gate unit. Nevertheless, it is useful if the power supply can be powered by the main circuit through the IGBTs, to reduce the need for any external power source.

Consequently, there is a need to provide a power supply for providing power to control a power switch which does not require the power switch to be blocking to function.

SUMMARY

An object is to alleviate or eliminate the problems described above.

According to a first aspect, it is presented a power supply for providing power to control a power switch for a high voltage application. The power supply comprises: a high voltage divider arranged to be connected to a first current terminal of the power switch; a step down DC/DC converter connected to an output of the high voltage divider, wherein the step down DC/DC converter is arrange to provide an output voltage for control of the at least one power switch to an output of the power supply; and a bypass control unit arranged to control the high voltage divider to short circuit an main input and a main output of the high voltage divider when the voltage across the power switch is lower than a threshold voltage. This allows the power supply to provide a suitable output power for a great range of input voltages. Moreover, the power supply can be connected across the power switch, eliminating any need for an additional power source.

The power supply may further comprise: a power limiter connected between an output of the step down DC/DC converter and the output of the power supply. In this way, a suitable output power for a gate unit is ensured.

The power supply may further comprise: a voltage polarity dependent switch arranged to be connected to a second current terminal of the power switch and the output of the step down DC/DC converter; and a step up DC/DC converter connected to the voltage polarity dependent switch and the output of the power supply. The voltage polarity dependent switch allows the power supply to supply power even when a reverse voltage is applied to the power switch. Through the step up DC/DC converter, a suitable output voltage from the power supply is ensured, even if the input voltage to the power supply is low.

The high voltage divider may comprise a plurality of serially connected resistors, selectively controlled to be part of a circuit between the first current terminal of the power switch and the first DC/DC converter. When the input voltage is high, the resistors are connected to lower the output voltage of the high voltage divider.

The high voltage divider may comprise a plurality of serially connected capacitors, selectively controlled to be part of a circuit between the first current terminal of the power switch and the first DC/DC converter.

The high voltage divider may comprise a plurality of serially connected transistors, each transistor being individually controlled by the bypass control unit. The transistors can be controlled to conduct when the input voltage is low, whereby the resistors of the high voltage divider are bypassed.

The bypass controller may comprise a voltage divider, comprising a plurality of resistors, and diodes arranged to block any current from the high voltage divider. The diodes allow a voltage to be provided from the output of the power supply to the bypass controller to block the transistors for the low voltage case. On the other hand, the diodes prevent any reverse current from the high voltage divider to the output through the bypass controller.

The voltage polarity dependent switch may comprise a diode bridge.

The step down DC/DC converter may comprise a Zener diode to control its output voltage.

The word 'plurality' in the description and claims is to be interpreted as meaning 'more than one'.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which:

FIG. 3 is a schematic diagram illustrating an embodiment of a high voltage divider of FIG. 2;

FIG. 4 is a schematic diagram illustrating an embodiment of a bypass control unit of FIG. 2;

FIG. 5 is a schematic diagram illustrating an embodiment of a step down DC/DC converter of FIG. 2;

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1:
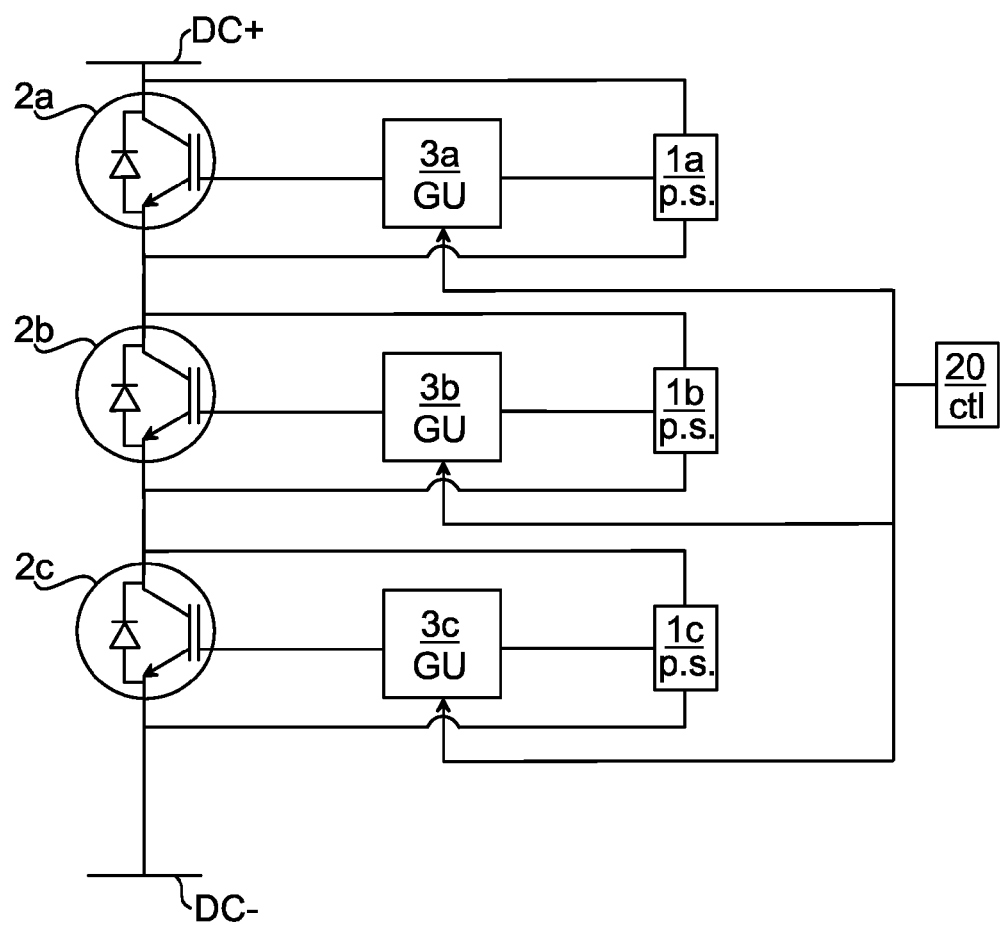
FIG. 1 is a schematic diagram illustrating an environment where embodiments presented herein can be applied.

FIG. 1 is a schematic diagram illustrating an environment where embodiments presented herein can be applied. In this example, an application is shown where three power switches 2a-c are used to control a main current, to thereby act as a DC breaker. While it is here presented three power switches 2-c, any suitable number of switches can be selected to achieve desired high voltage capacity across the power switches.

The power switches 2a-c can be any suitable controllable power switch, such as an insulated-gate bipolar transistor (IGBT). A controller 20 provides a signal to three gate units 3a-c, respectively connected to the three power switches 2a-c. The gate units 3a-c are respectively powered by three power supplies 1a-c.

In the DC breaker application, the power switches 2a-c are normally in a conducting state. Due to this, conventional power supplies for gate units, relying on a voltage difference over the power switch, can not be used. Moreover, there is a great variation in input voltage for the power supply, which conventional power supplies are unable to handle.

Instead, the power supplies 1a-c are structured to be able to supply power to the respective gate units 3a-c under a variety of electrical conditions, which is explained in more detail below.

Figure 2:
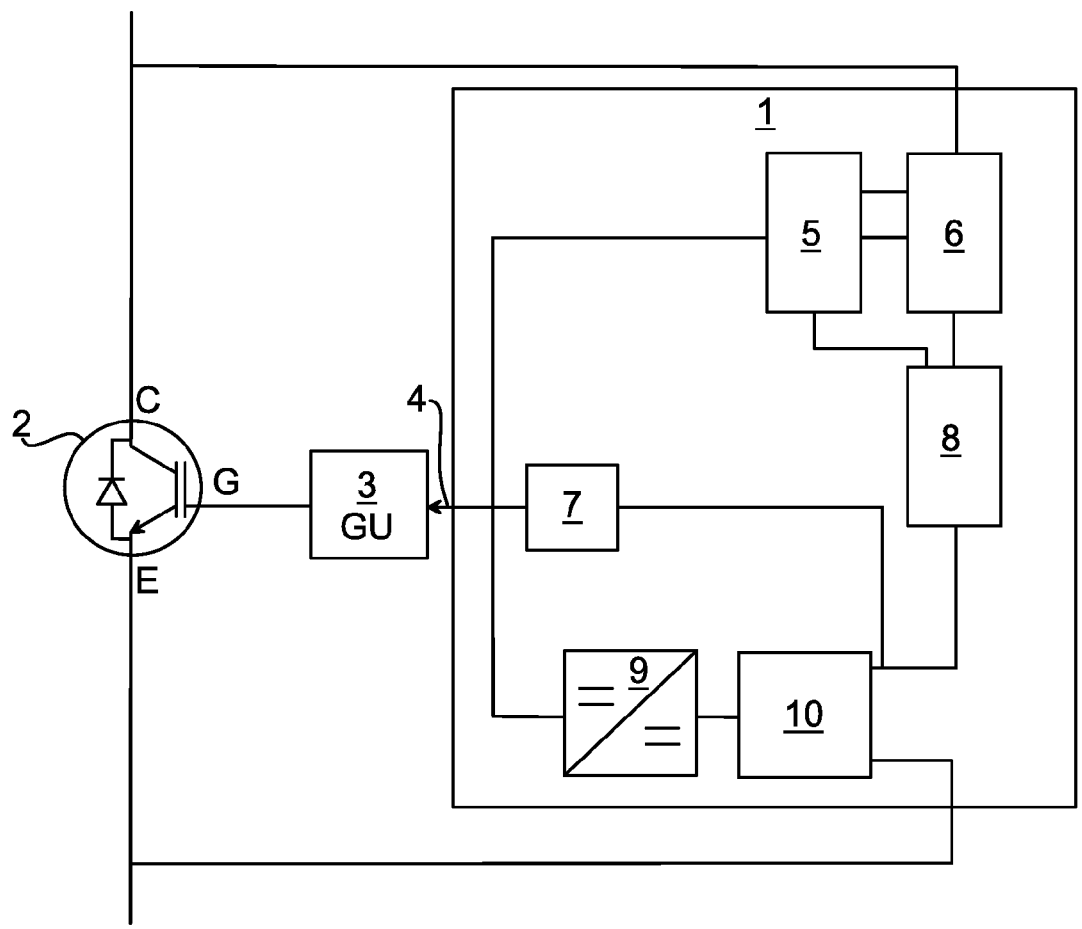
FIG. 2 is a schematic diagram illustrating a power supply and connected components of FIG. 1.

FIG. 2 is a schematic diagram illustrating a power supply 1 and connected components of FIG. 1. The power switch 2 can be any one of power switches 2a-c of FIG. 1. Analogously, the gate unit 3 can be any one of the gate units 3a-c and the power supply can be any one of the power supplies 1a-c. The controller of FIG. 1 is omitted in FIG. 2 in order not to obscure the disclosed embodiment. The power switch 2, in this case illustrated as an IGBT, comprises interface points in a gate G, and two current terminals being the emitter E and the collector C.

The power supply 1 comprises a high voltage divider 6 connected to the collector C of the power switch 2. A bypass control unit 5 is connected to several points of the high voltage divider 6 to control the high voltage divider to output a suitable voltage to a step down DC/DC converter 8. A power limiter 7 conditions the signal provided on an output 4 to the gate unit, such that the supplied voltage and/or current is not too high.

Furthermore, a voltage polarity dependent switch 10 is connected to the emitter E of the power switch 2 and the output of the step down DC/DC converter 8. An output of the voltage polarity dependent switch 10 is connected to a step up DC/DC converter 9. An output of the step up DC/DC converter 9 is connected to the output 4 of the power supply 1.

In this way, the voltage polarity switch will provide a positive voltage to the step up DC/DC converter 10 regardless if the voltage between the emitter E and collector C is positive or negative.

FIG. 3 is a schematic diagram illustrating an embodiment of the high voltage divider 6 of FIG. 2. The high voltage divider comprises a string of a plurality of m serially connected transistors 14a-m. The transistors can e.g. be MOSFETs (metal-oxide-semiconductor field-effect transistors), since the voltage drop across these is low. In parallel with the string of transistors 14a-m, a string of n serially connected resistors 13a-n and a string of n serially connected capacitors 12a-n are provided. The capacitors 12a-n are used for any necessary AC biasing. The number of transistors, resistors and capacitors can be any suitable number.

The gates of the transistors 14a-n are connected to a respective input 30a-m. All inputs 30a-m are connected to the bypass controller unit 5.

When the voltage across a connected power switch is low, the bypass controller short circuits the transistors, whereby there is negligible voltage drop through the high voltage divider 6. On the other hand, when the voltage across the connected power switch is high, the bypass controller controls the transistors 14a-m such that at least part of the current goes through the resistors 13-n. In this way, the high voltage input drops through the high voltage divider 6.

FIG. 4 is a schematic diagram illustrating an embodiment of the bypass control unit 5 of FIG. 2. The bypass control unit 5 comprises a number of outputs 32a-m respectively connected to the inputs 30a-m of the high voltage divider 6. The input 34 of the bypass controller unit 5 is connected to the output 4 of the whole power supply 1 (FIG. 2).

The bypass control unit 5 optionally comprises a voltage divider 24 comprising a number of resistors 23a-m, where each level in the voltage divider 24 is connected to a respective output 32a-m, via respective a diode 22a-m and output resistor 21a-m.

The bypass control unit 5 thus provides a bias gate voltage for each transistor 14a-m in the high-voltage divider 6 to force a conducting state. In this way, the transistors 14a-m shortcuts the voltage across the power switch through the high voltage divider 6 only if the primary voltage is within low voltage levels.

Furthermore, the bypass control unit 5 provides a bias voltage for the step down DC/DC converter 8.

With reference also to FIGS. 2 and 3, the output voltage at the output 4 is applied to the bypass controller 5 which provides the voltage to the gates of the transistors 14a-m. When the gate voltage of the transistors 14a-m is higher than the voltage on the output 4, e.g. when the power switch is in a blocking state, and the voltage across the power switch 2 is high, the diodes 22a-m block reverse current from the high voltage divider 6 to the output 4. Conversely, when the voltage across the power switch 2 is low, the gate voltages on the transistors 14a-m is low, whereby a voltage is fed from the output 4 to the gates of the transistors 14a-m to make then conduct and let the controlled current bypass the resistors 13a-n. The resistors 13a-n of the high voltage divider can be selected to tune the output voltage of the high voltage divider 6 accordingly.

FIG. 5 is a schematic diagram illustrating an embodiment of the step down DC/DC converter 8 of FIG. 2. In this embodiment, the step down DC/DC converter 8 comprises one or more Zener diodes 30 to control the output voltage to a suitable level. Other structures which provide a controlled voltage output are equally possible.

Figure 6:
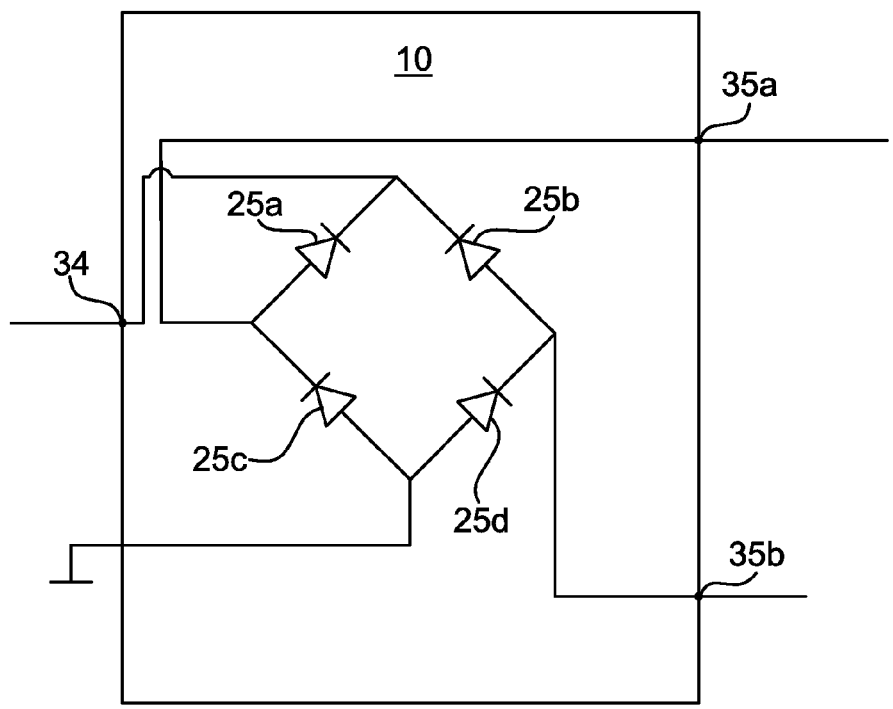
FIG. 6 is a schematic diagram illustrating an embodiment of a voltage polarity dependent switch of FIG. 2.

FIG. 6 is a schematic diagram illustrating an embodiment of the voltage polarity dependent switch 10 of FIG. 2. There are two inputs 35a-b to the voltage dependent switch 10, where a first input 35a is connected to the output of the step down DC/DC converter 8 and the second input is connected to the emitter E of the power switch 2 (see FIG. 2). The voltage polarity dependent switch 10 comprises four diodes 25a-d making up a diode bridge, whereby an output 34 of the voltage polarity dependent switch 10 always provides a positive voltage, regardless of the voltage sign across the collector C and emitter E of the power switch 2 (FIG. 2).

Figure 7:
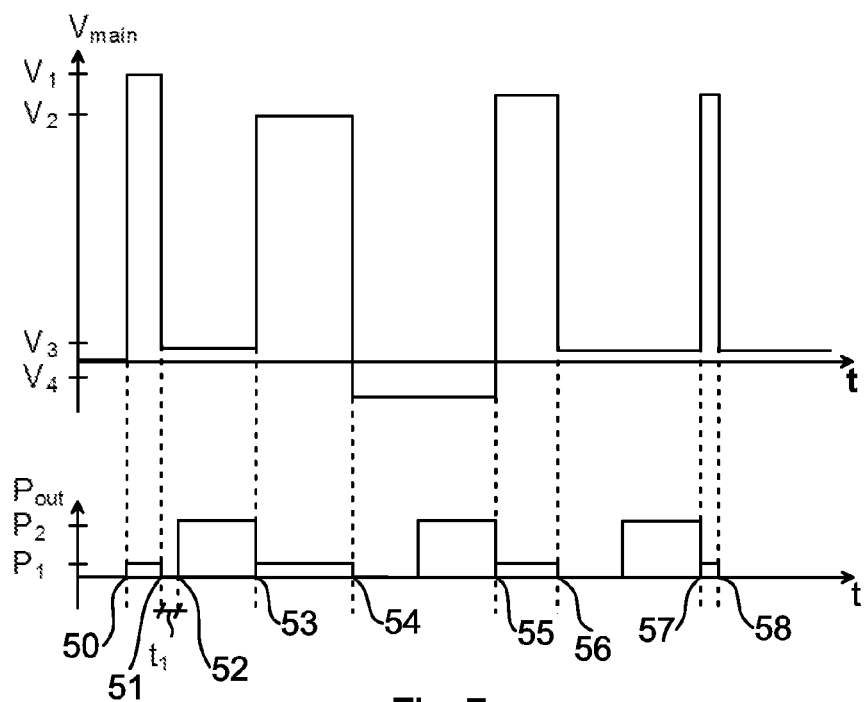
FIG. 7 shows two graphs illustrating the function of the power supply of FIG. 2.

FIG. 7 shows two graphs illustrating the function of the power supply of FIG. 2. In the upper part of FIG. 7, a main voltage, defined as a voltage between the emitter E and collector C of the power switch 2 is shown over time. In the lower part of FIG. 7, power output of the power supply 1 is shown over time using the same time scale as the upper part. It is to be noted that the vertical scales of the two graphs are not proportional.

The graphs will now be explained in conjunction with references to FIG. 2.

At a time 50, the power switch 2 is controlled to be in a blocking state, whereby $v_{main}$ increases to $v_1$. The power supply here supplies a power $P_1$.

At time 51, the power switch 2 is controlled to be in a conductive state, whereby $v_{main}$ decreases to $v_3$, which is the voltage drop over the power switch 2, e.g. 3 volts. There is a delay $t_1$ between the voltage drop at time 51 and time 52, at which point the high voltage divider has altered the states of its transistors 14a-m, under the control of the bypass control unit 5, to all be conducting. In this way, the resistors 13a-n of the high voltage divider are all bypassed, such that the voltage output of the high voltage divider 6 is the voltage of the collector C, less any voltage drop over the transistors 14a-m. The current is then routed to the voltage polarity dependent switch 10 and to the step up DC/DC converter 9 to provide an output voltage to the gate unit 3 which is suitable for being able to control the power switch 2. Here, an output power $P_2$ is supplied to the connected gate unit.

At time 53, the power switch 2 is again controlled to be in a blocking state, whereby the bypass controller blocks the transistors of the high voltage divider 6, to force the current through the resistors of the high voltage divider.

At time 54, the power switch 2 is reverse biased. The current then goes in upwards through the power switch 2 of FIG. 2. This results in a reverse voltage of $v_4$, which is the voltage drop through the freewheel diode of the power switch 2. In one example, the reverse voltage $v_4$ is –3 volts.

Time 55 corresponds to time 53 and time 56 corresponds to time 51. Analogously, time 57 corresponds to time 53 and time 58 corresponds to time 51.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A power supply for providing power to control a power switch for a high voltage application, the power supply comprising:
   a high voltage divider arranged to be connected to a first controlled current terminal of the power switch;
   a step down DC/DC converter connected to an output of the high voltage divider, wherein the step down DC/DC converter is arrange to provide an output voltage for control of the at least one power switch to an output of the power supply;
   a bypass control unit arranged to control the high voltage divider to short circuit a main input and a main output of the high voltage divider when the voltage across the power switch is lower than a threshold voltage; and
   a voltage polarity dependent switch arranged to be connected to a second controlled current terminal of the power switch and the output of the step down DC/DC converter; and
   a step up DC/DC converter connected to the voltage polarity dependent switch and the output of the power supply.

2. The power supply according to claim 1, further comprising:
   a power limiter connected between an output of the step down DC/DC converter and the output of the power supply.

3. The power supply according to claim 1, wherein the high voltage divider comprises a plurality of serially connected resistors, selectively controlled to be part of a circuit between the first controlled current terminal of the power switch and the first DC/DC converter.

4. The power supply according to claim 1, wherein the high voltage divider comprises a plurality of serially connected capacitors, selectively controlled to be part of a circuit between the first controlled current terminal of the power switch and the first DC/DC converter.

5. The power supply according to claim 1, wherein the high voltage divider comprises a plurality of serially connected transistors, each transistor being individually controlled by the bypass control unit.

6. The power supply according to claim 1, wherein the bypass controller comprises a voltage divider, comprising a plurality of resistors, and diodes arranged to block any current from the high voltage divider.

7. The power supply according to claim 1, wherein the voltage polarity dependent switch comprises a diode bridge.

8. The power supply according to claim 1, wherein the step down DC/DC converter comprises a Zener diode to control its output voltage.

9. The power supply according to claim 2, wherein the high voltage divider comprises a plurality of serially connected resistors, selectively controlled to be part of a circuit between the first controlled current terminal of the power switch and the first DC/DC converter.

10. The power supply according to claim 2, wherein the high voltage divider comprises a plurality of serially connected capacitors, selectively controlled to be part of a circuit between the first controlled current terminal of the power switch and the first DC/DC converter.

11. The power supply according to claim 3, wherein the high voltage divider comprises a plurality of serially connected capacitors, selectively controlled to be part of a circuit between the first controlled current terminal of the power switch and the first DC/DC converter.

12. The power supply according to claim 2, wherein the high voltage divider comprises a plurality of serially connected transistors, each transistor being individually controlled by the bypass control unit.

13. The power supply according to claim 3, wherein the high voltage divider comprises a plurality of serially connected transistors, each transistor being individually controlled by the bypass control unit.

14. The power supply according to claim 4, wherein the high voltage divider comprises a plurality of serially connected transistors, each transistor being individually controlled by the bypass control unit.

15. The power supply according to claim 2, wherein the bypass controller comprises a voltage divider, comprising a plurality of resistors, and diodes arranged to block any current from the high voltage divider.

16. The power supply according to claim 3, wherein the bypass controller comprises a voltage divider, comprising a plurality of resistors, and diodes arranged to block any current from the high voltage divider.

17. The power supply according to claim 4, wherein the bypass controller comprises a voltage divider, comprising a plurality of resistors, and diodes arranged to block any current from the high voltage divider.

18. The power supply according to claim 5, wherein the bypass controller comprises a voltage divider, comprising a plurality of resistors, and diodes arranged to block any current from the high voltage divider.

19. The power supply according to claim 2, wherein the voltage polarity dependent switch comprises a diode bridge.

20. The power supply according to claim 3, wherein the voltage polarity dependent switch comprises a diode bridge.

\* \* \* \* \*